United States Patent [19]
Olsen

[11] Patent Number: 6,150,234
[45] Date of Patent: Nov. 21, 2000

[54] TRENCH-DIFFUSION CORNER ROUNDING IN A SHALLOW-TRENCH (STI) PROCESS

[75] Inventor: Christopher S. Olsen, Newark, Calif.

[73] Assignee: VLSI Technology, Inc., San Jose, Calif.

[21] Appl. No.: 09/465,151

[22] Filed: Dec. 16, 1999

[51] Int. Cl.[7] .................................................. H01L 21/76
[52] U.S. Cl. ........................ 438/424; 438/435; 438/437; 438/296
[58] Field of Search .................... 438/294, 424, 438/228, 426, 436, 435, 437, 438, 427, 296, 618

[56] References Cited

U.S. PATENT DOCUMENTS

| | | | |
|---|---|---|---|
| 5,719,085 | 2/1998 | Moon et al. | 438/424 |
| 5,830,797 | 11/1998 | Cleeves | 438/296 |
| 5,854,505 | 12/1998 | Susuki et al. | 257/410 |
| 5,895,254 | 4/1999 | Huang et al. | 438/424 |
| 5,920,779 | 7/1999 | Sun et al. | 438/275 |
| 5,970,363 | 10/1999 | Kepler et al. | 438/435 |
| 6,001,706 | 12/1999 | Tan et al. | 438/424 |

OTHER PUBLICATIONS

B. E. Deal, et al., *Kinetics of the Thermal Oxidation of Silicon in $O_2/H_2O$ and $O_2/Cl_2$ Mixtures*, J. Electrochem. Soc. vol. 125, p. 339–346, 1978.

Dah–Bin Kao, *Two Dimensional Oxidation Effects in Silicon Experiments and Theory*, Ph.D. Thesis, Stanford, Jun. 1986.

P. Pan et al., *Trench Corner Rounding by Using Rapid Thermal Oxidation in $NF_3/O_2/Ar$ ambient*ECA Fall Meeting 1994, Extending Abstract, p. 748–749.

K. Ishimaru, et al. *Trench Isolation Technology with 1μm Depth n– and p–wells for A Full–CMOS SRAM Cell with j.4 μm n+/p+ Spacing*, 1994 Symposium on VLSI Technology Digest of Technical Papers.

A. Chatterjee, et al. *Integration of unit processing in a shalow trench isolation module for a 0.25 μm complementary metal–oxide semiconductor technology*, J. Vac. Technol. B 15(6) Nov./Dec. 1977, pp. 1936–1942.

S. Matsuda, et al., *Novel Corner Rounding Process for Shallow Trench Isolation utilizing MSTS (Micro–Structure Transformation of Silicon)*,IEDM Technical Digest, pp. 137–140, 1988.

C. P. Chang, et al., *A Highly Manufacturable Corner Rounding Solution for 0.18 μm Shallow Trench Isolation*, IEDM Technical Digest, pp. 661–664, 1997.

*Primary Examiner*—Matthew Smith
*Assistant Examiner*—Victor Yevsikov
*Attorney, Agent, or Firm*—Douglas L. Weller

[57] ABSTRACT

An isolation structure on an integrated circuit is formed using a shallow trench isolation process. On a substrate, a trench is formed. A thermal anneal is performed to oxidize exposed areas of the substrate to provide for round corners at a perimeter of the trench. The thermal anneal in performed in an ambient where a chlorine source is added to $O_2$ in order to minimize facets while creating the round corners. Oxidation time is lengthened by introducing an inert gas during the thermal anneal.

15 Claims, 6 Drawing Sheets

TRENCH-DIFFUSION CORNER ROUNDING IN A SHALLOW-TRENCH (STI) PROCESS

BACKGROUND

The present invention concerns the fabrication of integrated circuits and pertains particularly to trench-diffusion corner rounding in a shallow-trench (STI) process.

Shallow trench isolation (STI) is gradually replacing conventional local oxidation of silicon (LOCOS) process for the formation of an isolation structure as technology is evolving to submicron geometry. STI has various advantages over the conventional LOCOS process. For example, STI allows for the planarization of the isolation structure. This results in better control of critical dimension (CD) when defining a gate stack of a transistor. Better control of CD when defining the gate stack results in better control of CD in further processing steps which occur after the gate stack is defined. For sub 0.25 micron CMOS processes, Shallow Trench Isolation (STI) is required because of its planarity, high packing density and low junction edge capacitance.

In a typical STI process, a buffer oxide of 10 to 20 nanometers (nm) is thermally grown on wafer substrate. A nitride of approximately 200 nm is deposited and then patterned with lithography and etched down to silicon. An etch that is selective to silicon (etches mostly silicon) is then used to etch a trench into the silicon. A liner oxide is thermally grown to anneal out any damage to the silicon and passivate the silicon. Next, an oxide that is considerably thicker than the trench depth is deposited. The wafer is then subjected to a chemical-mechanical (CMP) polishing that stops when it reaches the nitride. The nitride is then stripped, along with the buffer oxide underneath, thereby forming the shallow trench isolation.

For the above-described STI processing scheme, the sharp corner where the trench side wall meets the silicon surface causes many problems with device performance, yield, and reliability. See, for example, P. Sallagoity, et al. "Analysis of Width Edge Effects in Advanced Isolation Schemes for Deep Submicron CMOS Technologies", IEEE Trans. Elect. Devices. Vol. 43, No. 11, November 1996.

For this reason, the top corner of the trench is rounded in order to achieve stable device performance (no kink in the subthreshold slope), reduce inverse narrow width effects and maintain good gate oxide integrity and low junction leakage.

Many techniques have been tried to round the top corner both before and after Chemo-Mechanical Polishing (CMP). The pre-CMP rounding techniques have included Hydrogen annealing (S. Matsuda, et al., *Novel Corner Rounding Process for Shallow Trench Isolation utilizing MSTS (Micro-Structure Transformation of Silicon)*, IEDM Technical Digest, pp. 137–140, 1998) and liner oxidation (see M. Nandakumar, et al., Shallow Trench Isolation for advanced VLSI CMOS Technologies, IEDM Technical Digest, pp. 133–136, 1998) that involves wet or dry oxidation at the proper temperature, time, ambient, and pre-clean. The post-CMP rounding techniques have involved high temperature wet oxidation, but if improperly designed can generate stress and lead to dislocation formation in the high stress areas. See F. Nouri, et al., *An Optimized Shallow Trench Isolation for sub 0.18 µm ASIC Technologies*, Proc. of Microelectronic Device Technology, SPIE Vol. 3506. pp. 156–166, 1998; and, C. P. Chang, et al., *A Highly Manufacturable Corner Rounding Solution for 0.18 µm Shallow Trench Isolation*, IEDM Technical Digest, pp. 661–664, 1997.

SUMMARY OF THE INVENTION

In accordance with the preferred embodiment of the present invention, an isolation structure on an integrated circuit is formed using a shallow trench isolation process. On a substrate, a trench is formed. A thermal anneal is performed to oxidize exposed areas of the substrate to provide for round corners at a perimeter of the trench. The thermal anneal in performed in an ambient where a chlorine source is added to $O_2$ in order to minimize facets while creating the round corners. Oxidation time is lengthened by introducing an inert gas during the thermal anneal.

In a preferred embodiment, the thermal anneal is performed at a temperature greater than 1050° C. Chlorine is introduced in a furnace oxidation in $O_2$ plus $C_2H_2Cl_2$ that decomposes to an equivalent 2% HCl. The inert gas introduced during oxidation to lengthen oxidation time is, for example, $N_2$.

The rounded corners at the perimeter of the trench increases the threshold voltage of the parasitic transistor at the corners of the trench. The rounded corners also allow for oxide at the corners to be thick enough to overcome immediate device failure and reliability issues.

DESCRIPTION OF THE PREFERRED EMBODIMENT

Figure 1:
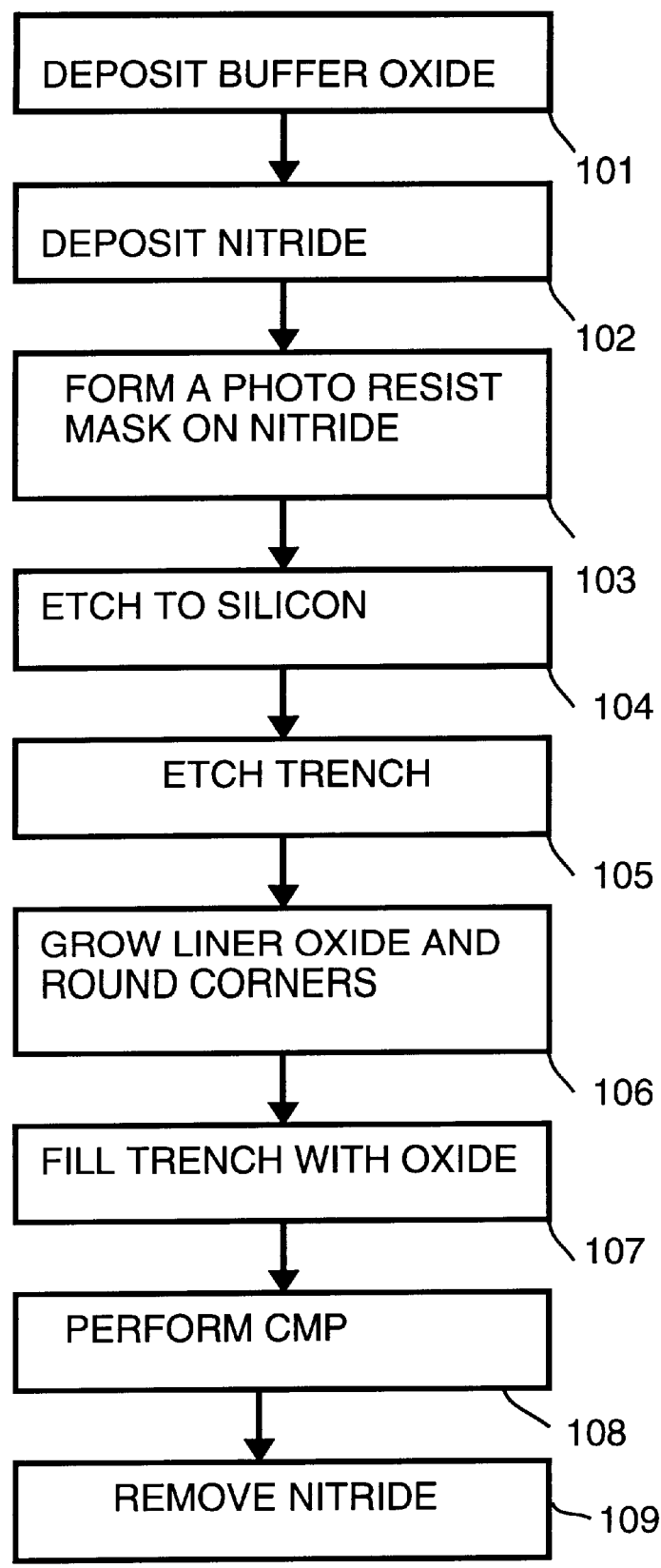
FIG. 1 is a flowchart for a shallow trench isolation process in accordance with a preferred embodiment of the present invention.
Figure 2:
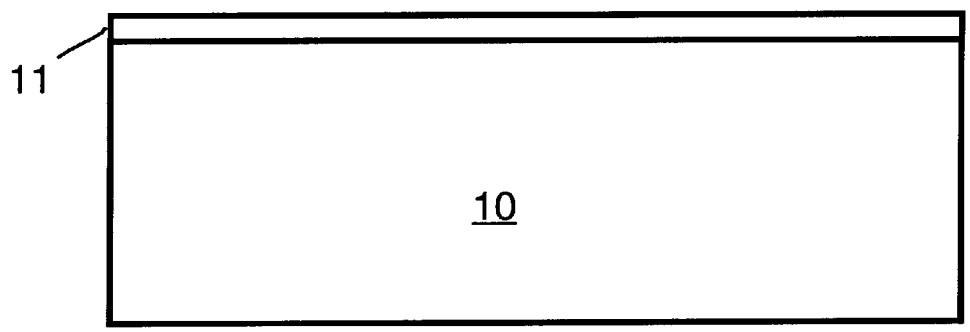
FIGS. 2, 3, 4, 5, 6, 7, 8 and 9 illustrate the shallow trench isolation process described in FIG. 1 in accordance with a preferred embodiment of the present invention.

FIG. 1 is a flowchart for a shallow trench isolation process in accordance with a preferred embodiment of the present invention. In a step 101, illustrated by FIG. 2, a layer of buffer (pad) oxide 11 is formed on a substrate 10 of a semiconductor wafer. For example, layer of buffer oxide 11 is formed by thermal oxidation of silicon to grow the oxide. The layer of buffer oxide is, for example, 10 to 20 nanometers (nm) thick.

Figure 3:
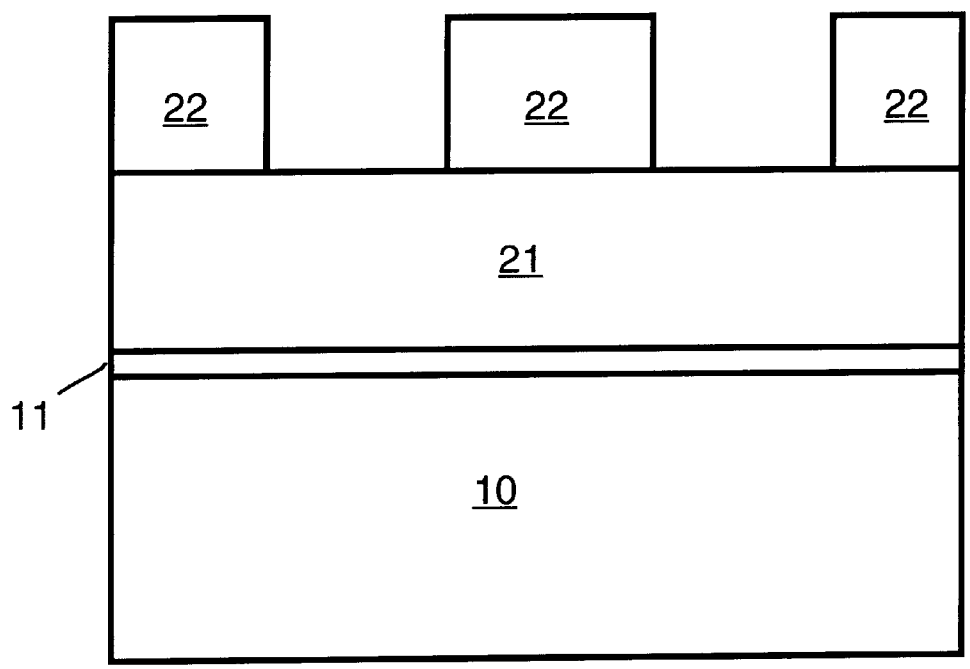

In a step 102, illustrated by FIG. 3, a layer of silicon nitride ($Si_3N_4$) 21 is formed on top of layer of buffer oxide 11. For example, layer of silicon nitride 21 is formed by low pressure chemical vapor deposition (LPCVD, $SiH_2Cl_2$+ $NH_3$•Dichlorosilane/Ammonia). The layer of silicon nitride 21 is, for example, approximately 200 nm thick.

In a step 103, also illustrated by FIG. 3, a photoresist pattern 22 is formed on silicon nitride layer 21 using photolithography.

Figure 4:
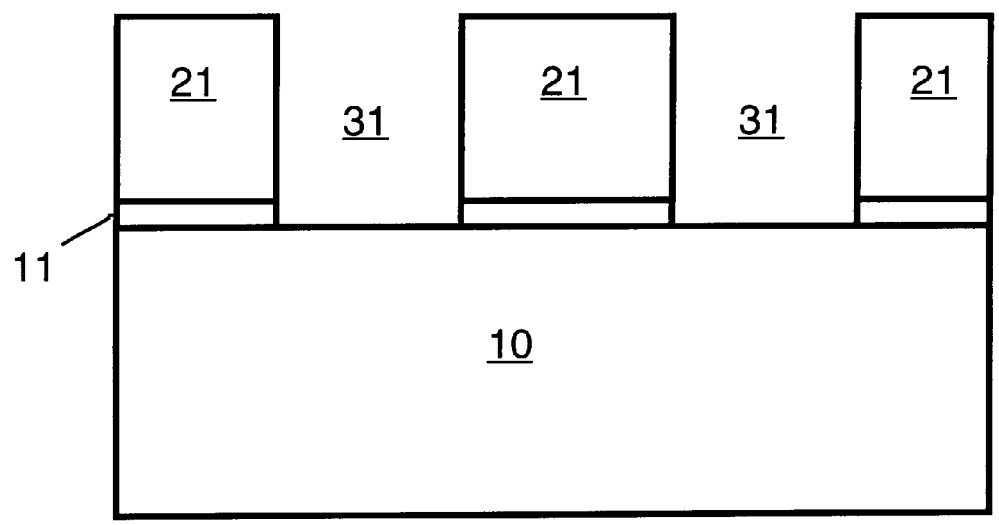

In a step 104, illustrated by FIG. 4, a dry etch process is used to etch through nitride layer 21 and buffer oxide 11 to substrate 10. Etched areas 31 indicate locations in which trenches will be formed.

Figure 5:
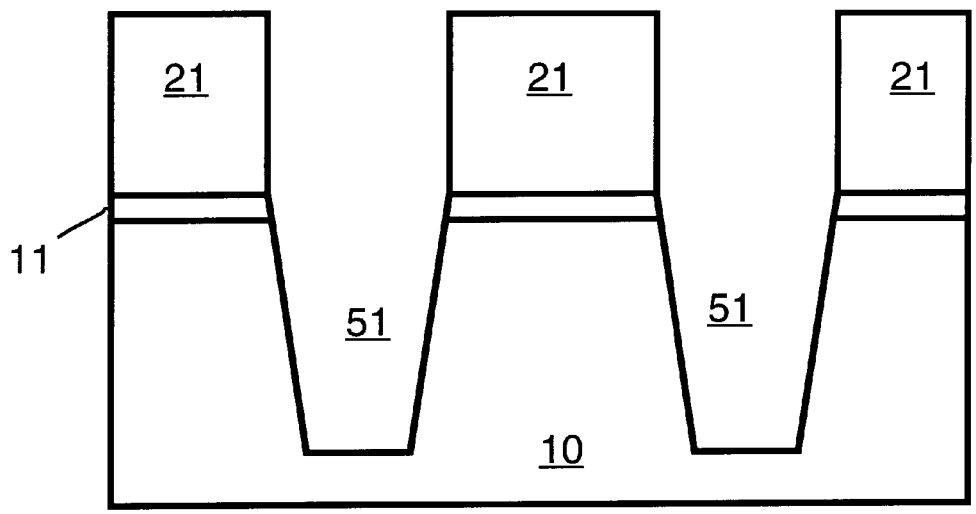

In a step 105, illustrated by FIG. 5, trenches 51 are formed by, for example, performing a dry etch of the silicon wafer. The dry etch can be one or more steps to etch the silicon and smooth out the sidewall profile. For example, trenches 51 are 0.25 microns wide and extend 0.3 microns below the surface of substrate 10.

Figure 6:
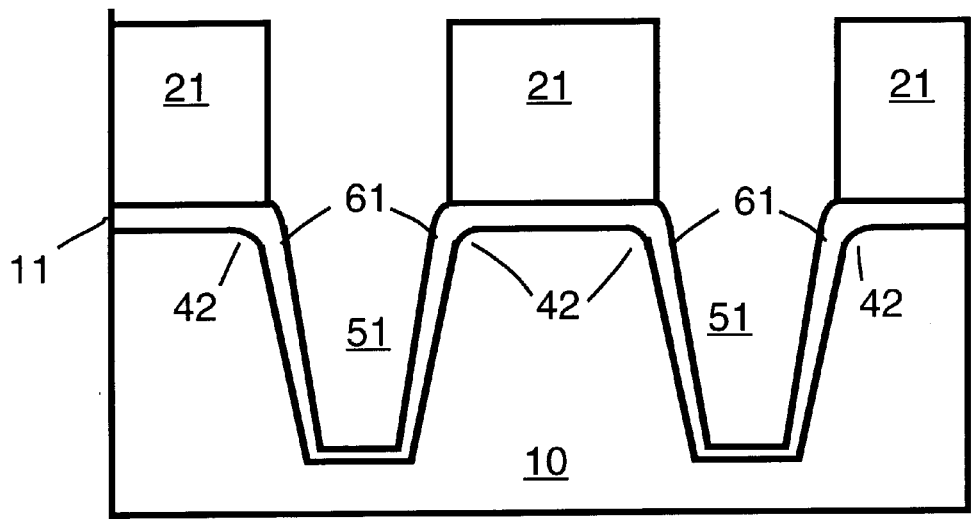

In a step 106, illustrated by FIG. 6, a layer of liner oxide 61 is thermally grown to anneal out any damage to the sidewalls of trenches 51, to passivate the silicon on the sidewalls, and to provide round corners 42 within the substrate at the edges of the trenches 51. The liner oxide is thermally grown in a chlorine oxygen ambient, for example, within a furnace with quartz walls.

In one embodiment of the present invention, chlorine is introduced in a furnace oxidation at 1075° C. in $O_2$ plus $C_2H_2Cl_2$ that decomposes to an equivalent 2% HCl. For this chlorine and oxygen process, improved top corner rounding has been observed. The 2% HCl reacts with $O_2$ to form 1% $H_2O$ in the furnace and acts to improve the top corner rounding compared to standard dry oxidation at the same temperature. Wet oxidation with a conventional pyrogenic torch (at 33% $H_2O$) at 1075° C. rounds the corners, but does show more facets than the chlorine process. It is hypothesized that the minimized facets with dilute $H_2O$ is because it slows the oxidation process compared to a higher $H_2O$ percentage pyrogenic torch process. This slowing of the oxidation moves the oxidation process into the parabolic region of the oxidation verses time dependence.

For example, in a paper, B. E. Deal, et al., *Kinetics of the Thermal* Oxidation of Silicon in $O_2/H_2O$ and $O_2/Cl_2$ Mixtures, J. Electrochem. Soc. Vol. 125, p. 339–346, 1978, it is observed for all oxidation temperatures and ambient that the linear oxide growth rate is greater for the (111) crystallographic plane verses the (100) crystallographic plane. The linear growth rate is more dominant at short times. These crystallographic differences are not present for the parabolic rate constant, which is more dominant at longer oxidation times. Specifically:

Short oxidation Tox=linear rate*(time+constant)

Long oxidation $(Tox)^2$=parabolic rate*time

Thus to minimize facets for any oxidation rounding process, the time should be extended while keeping the oxide thickness the same. One way to extend the oxidation time for the same oxide thickness is to lower the temperature. However, when the temperature is lowered, the rounding of the corners suffers.

Another way is to oxidize longer under the same conditions. However, then too much of the device active area is consumed. This longer oxidation time can be achieved with chlorine by using a diluted ambient (Chlorine+Oxygen+inert gas, Ar, $N_2$, . . . ) to slow the oxidation and move more into the parabolic region of the growth curve. Oxidizing for 12 minutes in 2% $HCl+O_2$ shows good rounding, but intermittent facets on some corners. Just reducing the HCl to 1% for the same conditions and time also shows the same intermittent facets. The more important change is increasing the time by oxidizing for 27 minutes by adding 16 slm of $N_2$ dilutes the HCl to 0.6%. This dilution slows down the oxidation rate, so that the same oxidation thickness is achieved in the previous cases, but in a longer time. This diluted HCl oxidation process shows less facets and similar rounding.

It is also possible that the presence of the chlorine during the oxidation retards the (111) plane crystalline growth relative to the (100) plane. The advantages of the chlorine oxidation are well rounded corners which minimizes the consumption of the active area and minimize sharp facets. The chlorine oxidation process is also very manufacturable running in any state-of-the-art oxidation furnace without any special modification.

The thermal chlorine and oxygen oxidation process also results in an oxide layer 41 being formed over the exposed areas of silicon. Oxide layer 41 has a thickness of approximately 2 nm to 30 nm. The thickness is chosen for a particular process so that in resulting circuitry, a parasitic transistor at corners 42 has a higher threshold voltage, and gate oxide at corners 42 is thick enough to overcome immediate device failure and reliability issues.

The degree of rounding for corners 42 can also be varied by changing how much the remaining portions of buffer oxide 11 are recessed under the remaining portions of silicon nitride layer 21, and by varying the amount of undercutting of buffer oxide 11 under silicon nitride layer 21.

The process creates a very round top corner (radius of curvature of 50 nm). The process overcomes poor margin in the rounding process when only $O_2$ is used in the oxidation process. It is suspected that when a typical (dry) oxidation is performed (without chlorine) changes in the background $H_2O$ concentration ($10–10^3$ ppm concentration) change the morphology. The dry oxidation at 1150° C. shows facets on the (111) crystalline planes that make the corners less rounded. This occurs because the intrinsic oxidation growth rate on the (111) crystalline planes is faster than (100) crystalline planes for the linear oxidation rate. These facets add sharp features to the trench shape that may be detrimental to device performance and die yield, due to stress concentration and high electric fields. The key to minimizing facets is to minimize this growth difference and to find the proper ambient and oxidation temperature and time, as described above.

Figure 7:
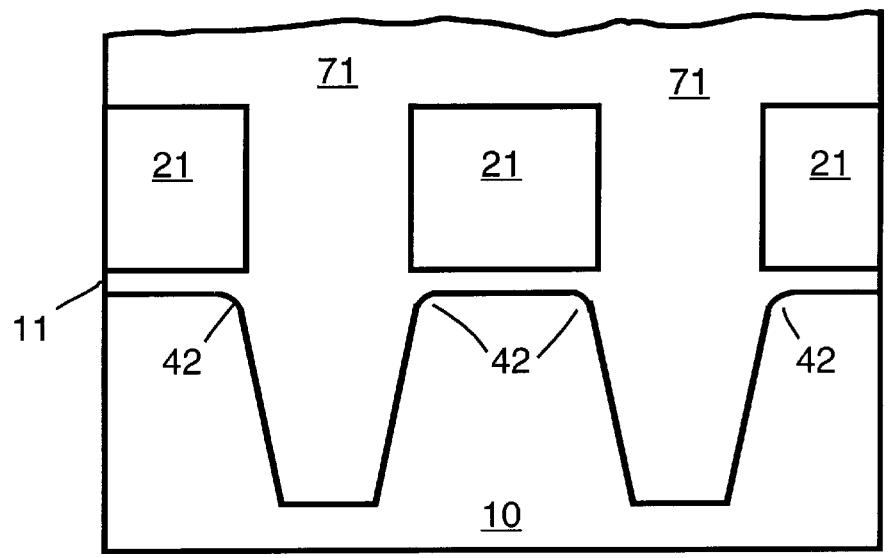

In a step 107, illustrated by FIG. 7, trenches 51 are filled by high density plasma (HDP) oxide with a fill oxide 71 to a height considerably thicker than the trench depth. For example, the HDP oxide extends 0.4 micron above the top surface of the remaining portions of silicon nitride layer 21.

Figure 8:
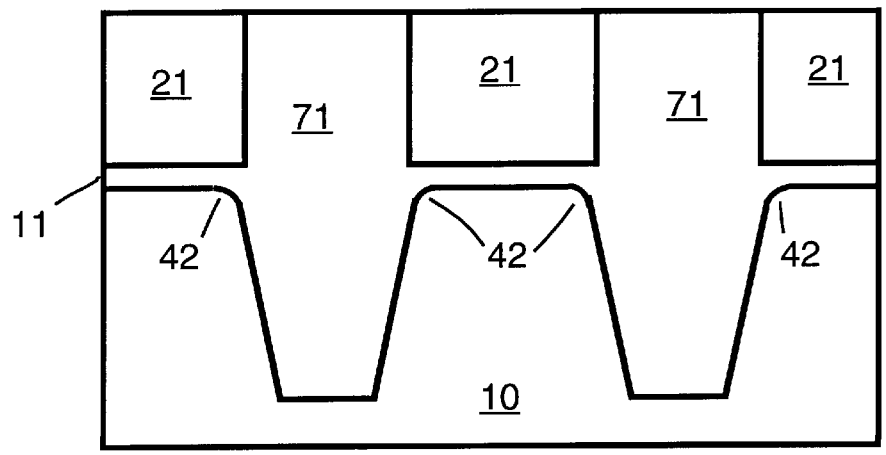

In a step 108, illustrated by FIG. 8, a chemical mechanical polish (CMP) process is performed to polish fill oxide 71 until the height of fill oxide 71 is at the level of the remaining portions of silicon nitride layer 21.

Figure 9:
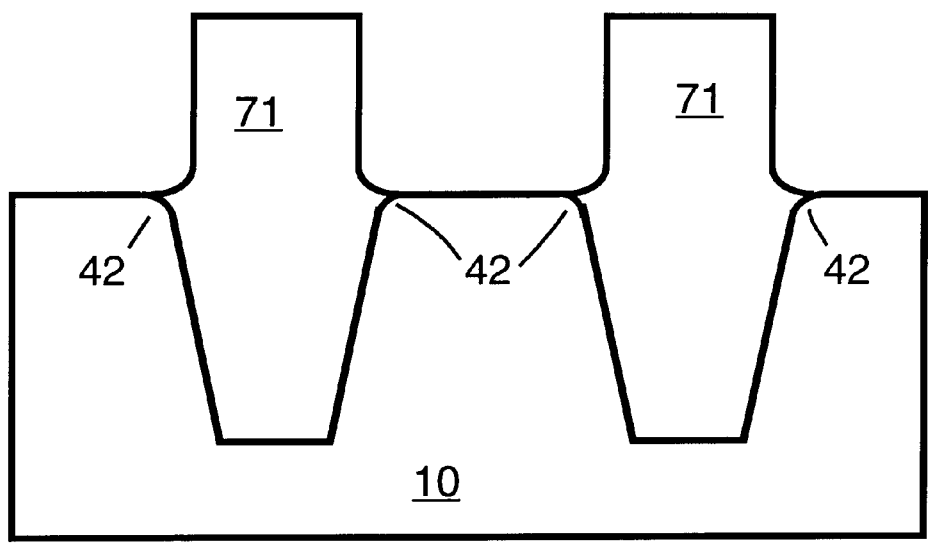

In a step 109, illustrated by FIG. 9, the remaining portions of silicon nitride layer 12 and the remaining portions of buffer oxide 11 are stripped away, for example, by a wet etch using a"hot" phosphoric acid solution. This results in shallow trench isolation.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for forming an isolation structure on an integrated circuit comprising the following steps:

(a) on a substrate, forming a trench; and, (b) performing a thermal anneal to oxidize exposed areas of the substrate to provide for round corners at a perimeter of the trench, including the following substeps:

(b.1) adding a chlorine source to $O_2$, when performing the thermal anneal in order to minimize facets while creating the round corners, and (b.2) lengthening oxidation time by introducing an inert gas during the thermal anneal.

2. A method as in claim 1 wherein in step (b), the thermal anneal is performed at a temperature greater than 1050° c.

3. A method as in claim 1 wherein in substep (b.1) chlorine is introduced in a furnace oxidation in $O_2$ plus $C_2H_2Cl_2$ that decomposes to an equivalent 2% HCl.

4. A method as in claim 1 wherein in substep (b.2) the inert gas is $N_2$.

5. A method as in claim 1 wherein in substep (b.1) chlorine is introduced in a furnace oxidation in $O_2$ plus $C_2H_2Cl_2$ that decomposes to an equivalent 2% HCl and in substep (b.2) addition of the inert gas dilutes the HCl to less than 1.0%.

6. A method as in claim 1 wherein in substep (b.1) chlorine is introduced in a furnace oxidation in $O_2$ plus $C_2H_2Cl_2$ that decomposes to an equivalent 2% HCl and in substep (b.2) addition of the inert gas dilutes the HCl to approximately 0.6%.

7. A method as in claim 1 wherein the thermal anneal set out in step (b) is performed at a temperature of less than 1100° C.

8. A method for forming an isolation structure on an integrated circuit comprising the following steps:

(a) on a substrate, forming a layer of buffer oxide;

(b) forming a layer of nitride on the layer of buffer oxide;

(c) patterning the layer of nitride and the layer of buffer oxide to form a trench area;

(d) etching the substrate to form a trench within the trench area; and, (e) performing a thermal anneal to oxidize exposed areas of the substrate to provide for round corners at a perimeter of the trench, including the following substeps:

(e.1) adding a chlorine source to $O_2$, when performing the thermal anneal in order to minimize facets while creating the round corners, and (e.2) lengthening oxidation time by introducing an inert gas during the thermal anneal.

9. A method as in claim 8 wherein in step (e), the thermal anneal is performed at a temperature greater than 1050° c.

10. A method as in claim 8 wherein in substep (e.1) chlorine is introduced in a furnace oxidation in $O_2$ plus $C_2H_2Cl_2$ that decomposes to an equivalent 2% HCl.

11. A method as in claim 8 wherein in substep (e.2) the inert gas is $N_2$.

12. A method as in claim 8 additionally comprising the following steps:

(f) filling the trench with oxide;

(g) performing a chemical-mechanical polish of the oxide down to the nitride layer; and, (h) removing the nitride layer.

13. A method as in claim 8 wherein in substep (e.1) chlorine is introduced in a furnace oxidation in $O_2$ plus $C_2H_2Cl_2$ that decomposes to an equivalent 2% HCl and in substep (e.2) addition of the inert gas dilutes the HCl to less than 1.0%.

14. A method as in claim 8 wherein in substep (e.1) chlorine is introduced in a furnace oxidation in $O_2$ plus $C_2H_2Cl_2$ that decomposes to an equivalent 2% HCl and in substep (e.2) addition of the inert gas dilutes the HCl to approximately 0.6%.

15. A method as in claim 8 wherein the thermal anneal set out in step (e) is performed at a temperature of less than 1100° C.

* * * * *